(12) United States Patent
Langtry et al.

(10) Patent No.: US 8,374,022 B2
(45) Date of Patent: Feb. 12, 2013

(54) PROGRAMMING PHASE CHANGE MEMORIES USING OVONIC THRESHOLD SWITCHES

(75) Inventors: Timothy C. Langtry, San Jose, CA (US); Richard Dodge, Santa Clara, CA (US); Hernan Castro, Shingle Springs, CA (US); Derchang Kau, Cupertino, CA (US); Stephen Tang, Fremont, CA (US); Jeremy Hirst, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 355 days.

(21) Appl. No.: 12/642,915

(22) Filed: Dec. 21, 2009

(65) Prior Publication Data

US 2011/0149628 A1 Jun. 23, 2011

(51) Int. Cl.
*G11C 11/00* (2006.01)
(52) U.S. Cl. ........................................ 365/163; 365/158
(58) Field of Classification Search .................. 365/163, 365/158
See application file for complete search history.

(56) References Cited

U.S. PATENT DOCUMENTS

| | | | |
|---|---|---|---|
| 5,912,839 A * | 6/1999 | Ovshinsky et al. | 365/185.03 |
| 2003/0123284 A1 | 7/2003 | Lowry et al. | |
| 2004/0184331 A1 | 9/2004 | Hanzawa et al. | |
| 2006/0227591 A1 | 10/2006 | Lowry et al. | |
| 2007/0297213 A1* | 12/2007 | Czubatyj et al. | 365/148 |
| 2009/0034325 A1 | 2/2009 | Lowry et al. | |

OTHER PUBLICATIONS

Patent Cooperation Treaty, Notification of Transmittal of the International Search Report and the Written Opinion of the International Searching Authority mailed Jul. 20, 2011 in international application No. PCT/US2010/058233, 14 pages.
International Search Report and Written Opinion received for International Application No. PCT/US2010/058233, dated Jul. 20, 2011, 10 pages.

* cited by examiner

*Primary Examiner* — Michael Tran
(74) *Attorney, Agent, or Firm* — Trop, Pruner & Hu, P.C.

(57) ABSTRACT

A phase change memory using an ovonic threshold switch selection device may be programmed from one state to another by first turning on the ovonic threshold switch. After the voltage across the cell has fallen, the cell may then be biased to program the cell to the desired state.

28 Claims, 3 Drawing Sheets

PROGRAMMING PHASE CHANGE MEMORIES USING OVONIC THRESHOLD SWITCHES

BACKGROUND

This relates generally to phase change memories.

As used herein, a phase change memory is a device which uses a chalcogenide material as a memory element. A memory element is the element that actually stores information. Thus, as used herein, a phase change memory stores information on a memory element by changing the phase of the element between amorphous and crystalline phases. Generally, the amorphous phase is associated with what is called a reset state and the crystalline state is associated with what is called a set state. Multilevel memories may have a number of states intermediate between set and reset states.

In the programming operation, a phase change memory may be transitioned through the application of bias voltages and resulting currents to transition from amorphous to crystalline states or from crystalline to amorphous states. Generally, in these transitions, it is desirable to only change the phase of the cells you want to change and not the cells that you do not want to change.

Phase change memories are arranged in what is called a cross point memory where address lines are arranged in a grid. These address lines, normally called the bitline and word line, cross and memory elements span between the word lines and the bitlines. Generally, to select a memory element, a select device is added to each memory cell. That is, a memory cell may include a series connected select device and memory element.

In some phase change memories, an ovonic threshold switch is used as the select device. The ovonic threshold switch includes a chalcogenide material that does not change phase. Thus, the ovonic threshold switch does not meet the definition of a memory element set forth above.

BRIEF DESCRIPTION OF THE DRAWINGS

FIG. 1a is a more detailed depiction of a phase change memory cell, shown in FIG. 1, in accordance with one embodiment;

DETAILED DESCRIPTION

In accordance with some embodiments of the present invention, phase change memory cells may be programmed from one state to another in a way that reduces adverse effects on deselected cells. Particularly, in some embodiments, the selected cell is biased so that its ovonic threshold switch snaps back or turns on and then the voltage across the cell falls and an additional bias voltage is applied to the selected bitline to program the cell into the desired state. As a result, in some embodiments, the voltage experienced during this operation by a deselected cell on the selected bitline may be maintained at all times below the threshold voltage of its ovonic threshold switch. This reduces the possibility that the ovonic threshold switch in that deselected cell would turn on or snapback.

Figure 1:
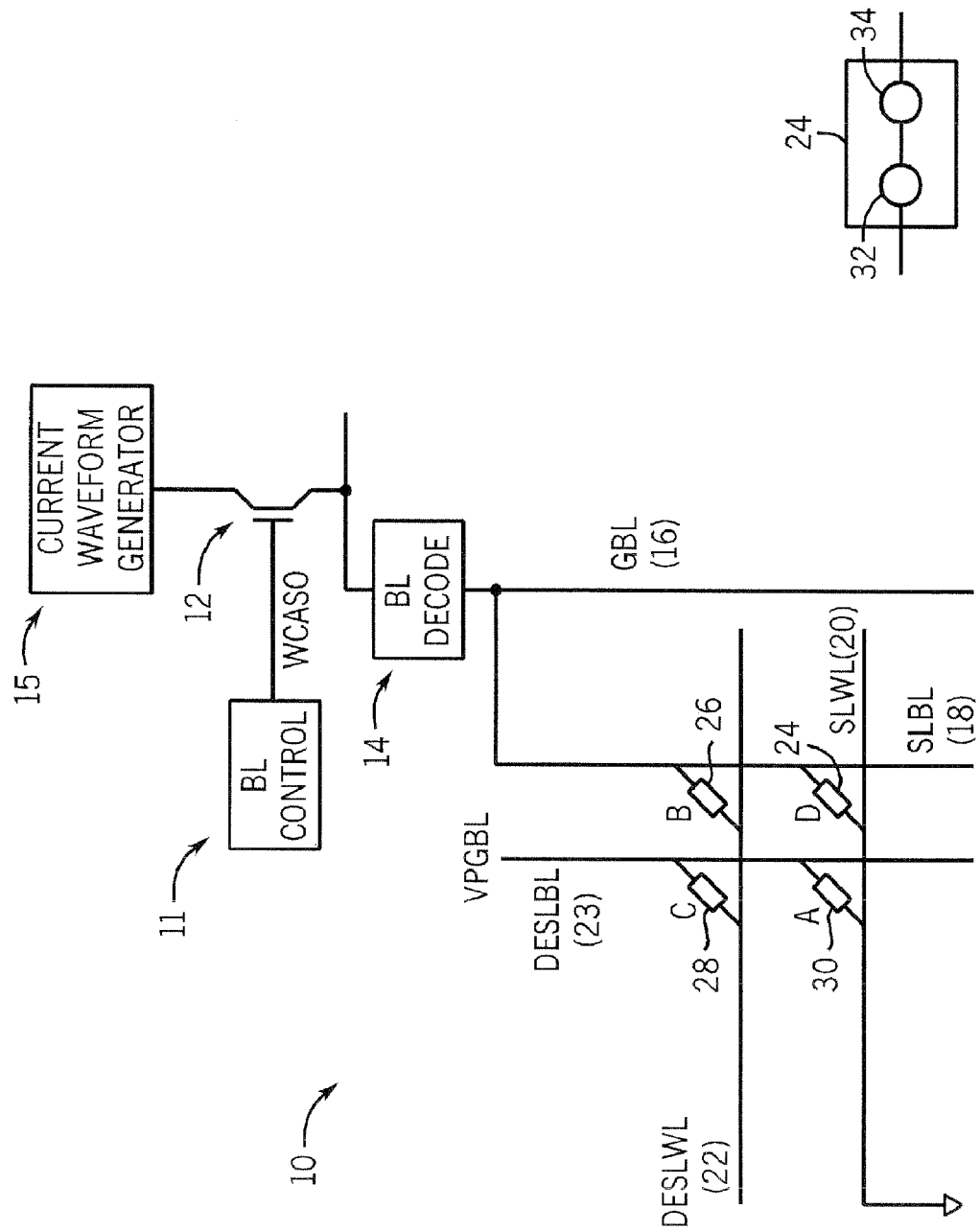
FIG. 1 is a partial circuit schematic of a phase change memory in accordance with one embodiment of the present invention.

Referring to FIG. 1, a phase change memory 10 may include an array of memory cells arranged in a cross point arrangement. The depiction in FIG. 1 shows only a few of those cells and only a portion of the relevant circuitry. A bitline bias control 11 controls the bias conditions on the global bitline (GBL) 16 and, as a result, the conditions on the selected local bitline (SLBL) 18. The bias control 11 is coupled to a cascode switch 12 which, in turn, is coupled to the bitline decode circuit 14 and a current waveform generator 15.

In the depiction shown in FIG. 1, only one deselected local word line (DES LWL) 22 is shown and only one deselected local bitline (DES LBL) 23 is illustrated for simplicity purposes. Thus, the memory cells 24, 26, 28, and 30 at the cross points are illustrated for the illustrated word lines and bitlines for simplicity sake.

As shown in Figure 1a, each memory cell, such as the selected memory cell 24, includes an ovonic threshold switch 32 in series with a phase change memory element 34. The ovonic threshold switch 32 functions as a select device to select the memory element 34 based on the bias across the cell 24. Thus, when the selected memory element 24 is appropriately biased, the ovonic threshold switch 32 turns on or snaps back, allowing current to pass through the memory element 34.

The inventors of the present application have appreciated that the memory cell 26 on the selected local bitline and a deselected word line is the cell which is most important in preventing undesired snapback of ovonic threshold switches in deselected memory elements. That is, because the voltage on the bitline must be raised high enough to select a memory element, the deselected cells on that selected local bitline may experience relatively high voltages, creating the risk of undesired deselected cell ovonic threshold switch snapback.

Figure 2:
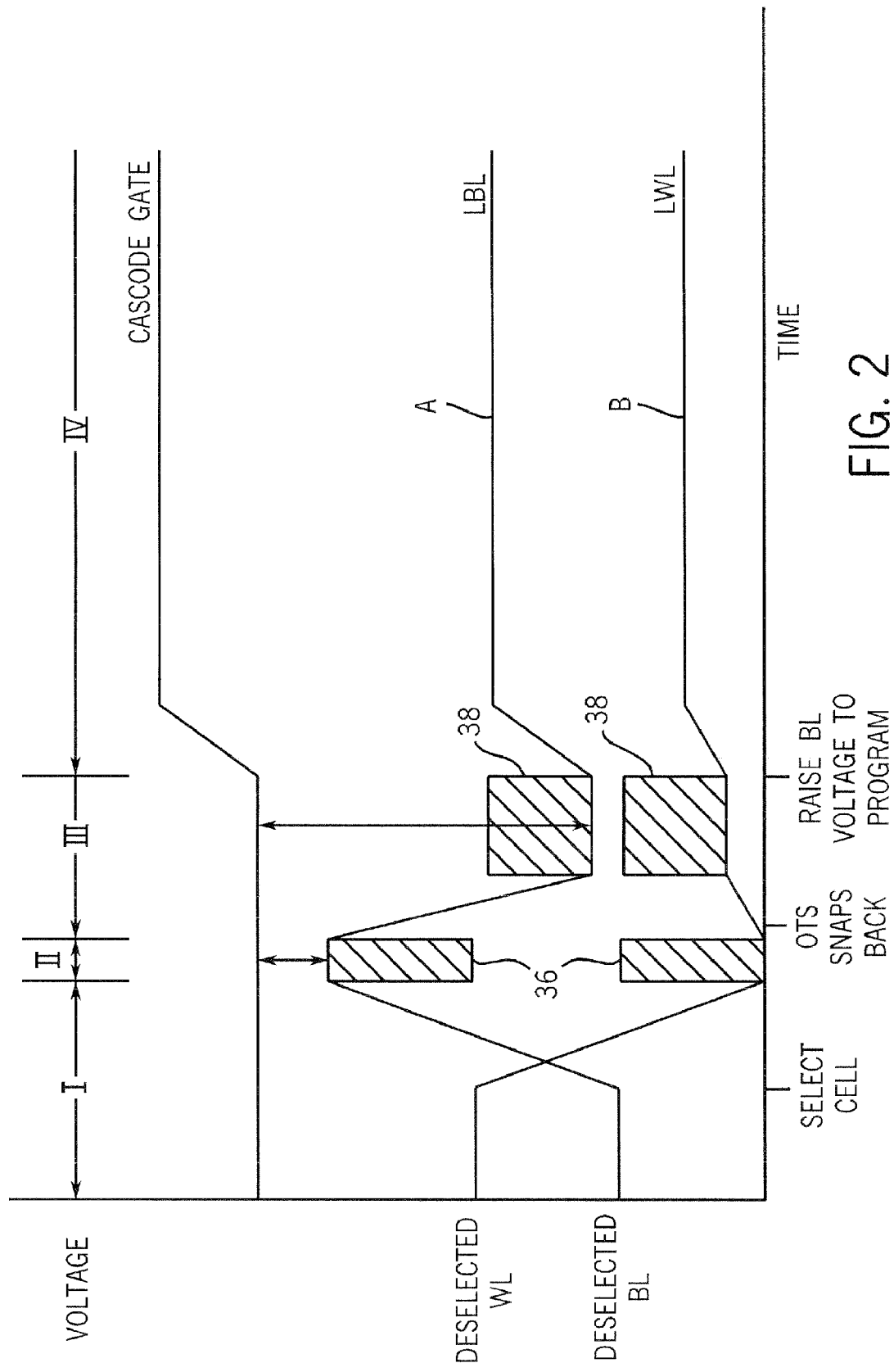
FIG. 2 is a graph of voltage versus time during the programming of a cell in accordance with one embodiment.

Referring to FIG. 2, a hypothetical graph of voltage versus time for programming the selected cell 24 from one state to another is illustrated. One plot, labeled LBL, shows the voltages on the local bitline (LBL) 18 and another plot, labeled LWL, shows the voltages on the local word line (LWL) 20. Initially, as indicated on the vertical axis, both the word line and bitline are at deselected voltage levels (indicated as Deselected WL and Deselected BL in FIG. 2). To this end, at the point indicated by the label "select cell" on the time axis, the voltage is increased on the selected bitline and decreased on the selected word line. This eventually causes the ovonic threshold switch in the selected cell 24 to snapback or turn on, as indicated by the label "OTS snaps back" on the time axis.

As a result of the switch turning on, current begins to flow through the cell, causing a drop in voltage on the now selected local bitline and a rise in voltage on the now selected local word line. Eventually, a steady state is reached and after this point, the voltage on the local bitline is increased, as indicated by the label "raise BL voltage to program" on the time axis.

Thus, the voltage of the selected local bitline rises to a level A to allow the desired current. At the same time the voltage rises to the level B on the selected local word line.

In the region I, the cell that is initially deselected is selected. In the region II, the ovonic threshold switch is turned on and snaps back. In the region III, the local bitline voltage falls and the local word line voltage rises until it reaches a steady state level. In the region IV, the voltage on the local bitline is increased and the cell is programmed to the desired state.

The cross hatched regions 36 show the voltage across the deselected cells (A and B in FIG. 1) that should not exceed a particular voltage (FIG. 3 or 4) in order to prevent inadvertent snapback of deselected ovonic threshold switches on the selected bitline (corresponding, for example, to the memory elements 26, labeled B, and 30, labeled A, in FIG. 1). If the voltage on the selected bitline gets high enough, the voltage across the ovonic threshold switch in the cell 26 can get high enough to exceed its threshold voltage, turning on that switch and causing snapback. This is a highly undesirable effect.

While it would be conventional to supply sufficient voltage, in the region II, to also program the cell, this can create the situation where some cells in the array that are deselected have their ovonic threshold switches inadvertently turned on because the voltage across those cells exceeded the ovonic threshold switch threshold voltage.

The same concept is illustrated with respect to the cross hatched area 38 in region III. Again, it is desirable to maintain the local bitline voltage such that the risk of inadvertent snapback in deselected cells on the selected bitline is reduced.

Figure 3:
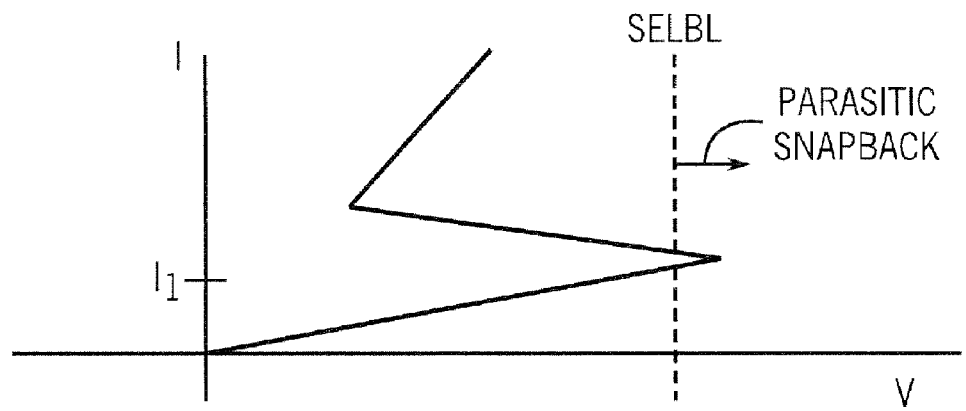
FIG. 3 is a graph of current versus voltage for the ovonic threshold switch of a deselected cell before the ovonic threshold switch of the selected cell snaps back.

Referring next to FIG. 3, a current versus voltage plot for the ovonic threshold switch of the cell 26 is depicted before the ovonic threshold switch in the selected cell 24 turns on or snaps back. This would correspond to the regions I and II in FIG. 2. As long as the voltage on this ovonic threshold switch is kept below the voltage indicated by the vertical dashed line, the risk of undesired or parasitic snapback is reduced.

Figure 4:
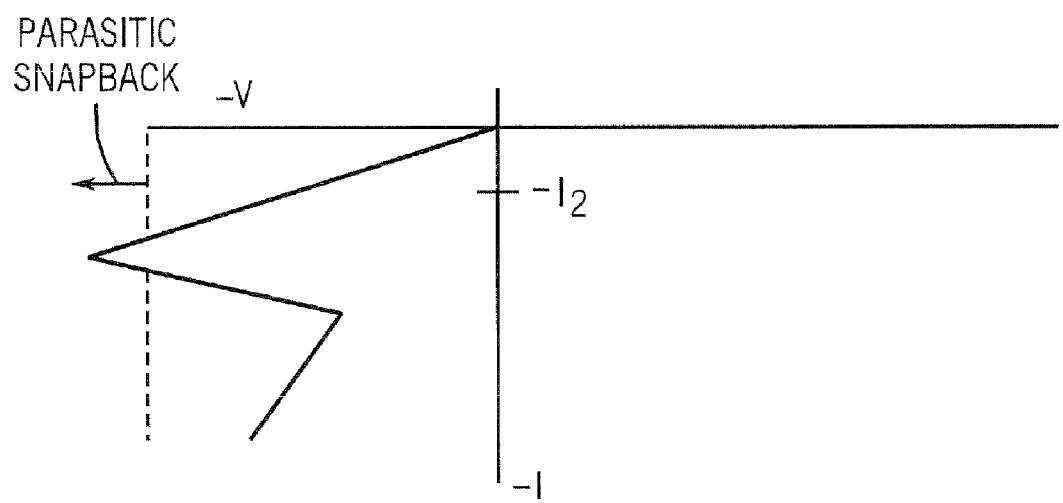
FIG. 4 is a graph of current versus voltage for the ovonic threshold switch of a deselected cell after the ovonic threshold switch of the selected cell snaps back.

FIG. 4 shows the same deselected ovonic threshold switch, after the ovonic threshold switch in the selected cell is snapped back. This would correspond to region IV in FIG. 2. At this point, the voltage across the deselected ovonic threshold switch in the cell 26 is negative, as is its current. Again, there is a voltage, indicated by a vertical dashed line, which should not be exceeded to avoid parasitic snapback. In this case, a vertical dashed line corresponding to the voltage across cell 26, defines the boundary for preventing parasitic snapback. As long as the voltage is maintained at a level above (or less negative than) that vertical dashed line, the possibility of inadvertent snapback in deselected ovonic threshold switches may be reduced or eliminated.

Thus, in some embodiments, the cascode transistor 12 gate voltage (labeled "cascode gate" in FIG. 2 and WCASO in FIG. 1) is increased in the region IV in FIG. 2, giving the circuit ample voltage head room to deliver the desired current pulse. The desired current pulse is generated by the current waveform generator 15 which controls the current passed by the cascode 12, in some embodiments. The voltage supplied by the bias control 11 to the gate of the cascode 12 is labeled "cascode gate" in FIG. 2.

The cell 24 may be programmed to a set or a reset state or any state that is more or less amorphous than its predecessor.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   programming a phase change memory cell from a first state to a second state by turning on an ovonic threshold switch; and
   after a time delay after said ovonic threshold switch has turned on, biasing the cell to program the cell to any second state.

2. The method of claim 1 including avoiding exposing a deselected cell on a selected bitline, coupled to said cell, to a voltage greater than the threshold voltage of its ovonic threshold switch.

3. The method of claim 1 including, after allowing the voltage on a selected bitline, coupled to said cell, to settle, raising the voltage on the selected bitline to program the cell.

4. The method of claim 1 including allowing the voltage on a selected word line, coupled to said cell, to drop before programming the cell.

5. The method of claim 1 including preventing the voltage on a deselected cell on a selected bitline and a deselected word line from exceeding a voltage that would turn on the ovonic threshold switch of that deselected cell.

6. The method of claim 1 including, after the ovonic threshold switch of the selected cell has turned on, preventing the ovonic threshold switch of a deselected cell on a selected bitline from exceeding a negative voltage that would turn on the deselected ovonic threshold switch.

7. The method of claim 1 including programming said cell from a reset to a set state.

8. The method of claim 1 including programming the cell from a more amorphous to a less amorphous state.

9. The method of claim 1 including programming said cell from a set to a reset state.

10. The method of claim 1 including programming the cell from a less amorphous to a more amorphous state.

11. An apparatus comprising:
    a phase change memory cell including a series connected ovonic threshold switch and chalcogenide memory element; and
    a device coupled to said cell to program said cell from a first to a second state by turning on said ovonic threshold switch and, after a time delay after said ovonic threshold switch has turned on, to bias the cell to program the cell to the second state.

12. The apparatus of claim 11 including an array of phase change memory cells, having memory elements and ovonic threshold switches, and address lines, wherein said selected cell is on a first selected address line and a second selected address line, said array including a second cell on said first selected address line, said second cell also on a third deselected address line, said apparatus to avoid exposing the second cell to a voltage greater than its threshold voltage, said second cell including a series connected ovonic threshold switch and chalcogenide memory element.

13. The apparatus of claim 12, said apparatus to raise the voltage on the first selected address line to program the selected cell after allowing the voltage on the first selected address line to settle.

14. The apparatus of claim 12, said apparatus to allow the voltage on the second address line to drop before programming the selected cell.

15. The apparatus of claim 12, said apparatus to prevent the voltage on the second cell from exceeding a voltage that would turn on its ovonic threshold switch.

16. The apparatus of claim 15, said apparatus to prevent the ovonic threshold switch of said second cell from exceeding a negative voltage that would allow the ovonic threshold switch of the second cell to turn on.

17. An apparatus comprising:
an array of phase change memory cells, each cell including a series connected ovonic threshold switch and chalcogenide memory element;
a plurality of address lines including a first set of address lines running in a first direction and a second set of address lines running in a second direction; and
a circuit to turn on an ovonic threshold switch of a selected cell and, after the voltage on one of said address lines has settled, program the memory element of said cell.

18. The apparatus of claim 17 wherein said selected cell is on a first selected address line and a second selected address line, said array including a second cell on said first selected address line, said second cell also on a third deselected address line, said apparatus to avoid exposing the second cell to a voltage greater than its threshold voltage.

19. The apparatus of claim 18, said apparatus to raise the voltage on the first selected address line to program the selected cell after allowing the voltage on the first selected address line to settle.

20. The apparatus of claim 18, said apparatus to allow the voltage on the second address line to drop before programming the selected cell.

21. The apparatus of claim 18, said apparatus to prevent the voltage on the second cell from exceeding a voltage that would turn on its ovonic threshold switch.

22. The apparatus of claim 21, said apparatus to prevent the ovonic threshold switch of said second cell from exceeding a negative voltage sufficient to turn on the ovonic threshold switch of the second cell.

23. A method comprising:
preventing a voltage on a deselected cell having an ovonic threshold switch in series with a chalcogenide memory element from exceeding a threshold voltage of the switch by turning on an ovonic threshold switch of a selected cell and thereafter, after allowing a voltage on a selected bitline to settle, programming the cell.

24. The method of claim 23 including raising the voltage on the selected bitline to program the cell.

25. The method of claim 23 including allowing the voltage on a selected word line to drop before programming the cell.

26. The method of claim 25 including, after the ovonic threshold switch of the selected cell has turned on, preventing the ovonic threshold switch of a deselected cell on a selected bitline from exceeding a negative voltage that would allow the deselected ovonic threshold switch to turn on.

27. The method of claim 23 including programming said cell from a reset to a set state.

28. The method of claim 23 including programming the cell from a more amorphous to a less amorphous state.

* * * * *